(12) United States Patent
Iwasaki et al.

(10) Patent No.: US 7,126,149 B2
(45) Date of Patent: Oct. 24, 2006

(54) PHASE CHANGE MEMORY AND PHASE CHANGE RECORDING MEDIUM

(75) Inventors: Tomio Iwasaki, Tsukuba (JP); Hiroshi Moriya, Chiyoda (JP); Hideyuki Matsuoka, Nishitokyo (JP); Norikatsu Takaura, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 5 days.

(21) Appl. No.: 10/975,522

(22) Filed: Oct. 29, 2004

(65) Prior Publication Data

US 2005/0156150 A1 Jul. 21, 2005

(30) Foreign Application Priority Data

Jan. 21, 2004 (JP) ............... 2004-012560

(51) Int. Cl.
*H01L 47/00* (2006.01)
*H01L 29/04* (2006.01)
(52) U.S. Cl. ............. 257/3; 257/2; 257/4; 257/E45.002
(58) Field of Classification Search ...... 257/3
See application file for complete search history.

(56) References Cited

U.S. PATENT DOCUMENTS

2003/0169675 A1* 9/2003 Kurokawa et al. ....... 369/275.2
2003/0185047 A1* 10/2003 Khouri et al. ............. 365/163
2003/0209746 A1* 11/2003 Horii .......................... 257/295
2005/0029505 A1* 2/2005 Lowrey ........................ 257/5

FOREIGN PATENT DOCUMENTS

| JP | 2001-229690 | 8/2001 |
| JP | 2003-142653 | 5/2003 |
| JP | 2003-229538 | 8/2003 |
| JP | 2001-127263 | 5/2004 |

OTHER PUBLICATIONS

Applied Physics vol. 71, No. 5 (2002) pp. 562-565.
Applied Physics vol. 71, No. 12 (2002) pp. 1513-1517.
Journal of Applied Physics vol. 54 (1983) p. 4877.

* cited by examiner

*Primary Examiner*—Tu-Tu Ho
(74) *Attorney, Agent, or Firm*—Antonelli, Terry, Stout and Kraus, LLP.

(57) ABSTRACT

A phase change memory comprises: a substrate; an insulation film formed on a main surface of the substrate; a first electrode deposited on the insulation film; a phase change recording film deposited on the first electrode; and a second electrode deposited on the phase change recording film. The phase change recording film contains at least two of Ge, Sb and Te as main constituting elements thereof. The first electrode comprises material of group of Ti, Si and N, or group of Ta, Si and N as main constituting material thereof.

12 Claims, 9 Drawing Sheets

PHASE CHANGE MEMORY AND PHASE CHANGE RECORDING MEDIUM

BACKGROUND OF THE INVENTION

The present invention relates to a phase change memory or a phase change recording medium, which is capable of recording/reproducing information by utilizing phase change.

In phase change recording method, recording is performed by unitizing a fact that material for a recording film undergoes phase change between crystal phase and amorphous phase and reading is performed by judging whether the recording film material is in the crystal phase or the amorphous phase, as disclosed in Applied Physics Vol. 71, No. 5 (2002) pp. 562–565, for example.

A chalcogenide, e.g. $GeSb_xTe_y$, is representative recording film material in such phase change recording method, but its amorphous phase is unstable and sometimes crystallized with the lapse of time. This trouble becomes worse under circumstances of high temperature. Further, there is a problem that properties of the recording film material are degraded by repetition of rewriting in a case where volume change in the phase change between crystal phase and amorphous phase is large. It is desired to restrain such degradation to improve the reliability of the phase change memory.

BRIEF SUMMARY OF THE INVENTION

A first object of the present invention is to provide a phase change memory and a recording medium with high reliability.

A second object of the present invention is to provide a phase change memory and a recording medium, which preserves its excellent performance even after repetition of writing and reading.

The inventors have researched and examined various means for stabilizing amorphous phase of a phase change recording film, and discovered that stabilization of the amorphous phase is achieved by bring another amorphous material, which has an atomic arrangement similar to the amorphous phase of the phase change recording film, into contact with the phase change recording film.

Further, with respect to the above teaching in "Applied Physics", the inventors have found that if a composition with high density of lattice imperfection is employed to improve repetition tolerance, regularity of an atomic arrangement in the crystalline state (i.e. erased condition) becomes inferior as an adverse effect due to increase of lattice imperfection and distinction from the amorphous phase becomes difficult. In this regard, the inventors have searched for other means effective for improvement of repetition tolerance, instead of employment of the composition with high density of lattice imperfection, and found that it is effective to impart tensile strain to the recording film.

It is possible to provide a phase change memory or a phase change recording medium which contributes to solve any of the above-described problems on the basis of the above-described discoveries.

Concretely, for example, it is possible to provide a phase change memory or recording medium with high reliability.

Alternatively, further, it is possible to provide a phase change memory and a phase change recording medium with high rewriting repetition tolerance.

Subject matter of the present invention is solved by a phase change memory or a phase change recording medium having the following structure.

According to one aspect of the present invention, there is provided a phase change memory comprising: a substrate; an insulation film formed on a main surface of the substrate; a first electrode deposited on the insulation film; a phase change recording film deposited on the first electrode; and a second electrode deposited on the phase change recording film, wherein the phase change recording film contains at least two of Ge, Sb and Te as main constituting elements thereof, and the first electrode comprises material of group of Ti, Si and N, or group of Ta, Si and N as main constituting material thereof.

Concentration of Si in the first electrode film is preferably between 0.07–33 at. %.

The first electrode film comprises $TiSi_xN_y$ or $TaSi_xN_y$ formed by chemical vapor deposition or plating.

The second electrode is a film formed by at least one of oxidizing, nitriding and oxynitriding.

The phase change recording film contains Zn as a constituting element.

Difference in an average distance between nearest neighbor atoms between the phase change recording film and the first electrode is within 3% of the average distance between nearest neighbor atoms of the phase change recording film.

The first electrode comprises a first electrode layer and a second electrode layer located between the first electrode layer and the phase change recording film, and the second electrode layer has an average distance between nearest neighbor atoms more closer to an average distance between nearest neighbor atoms of main constituting material of the phase change recording film than an average distance between nearest neighbor atoms of the first electrode layer.

According to a second aspect of the present invention, there is provided a phase change memory comprising: a substrate; a first layer, in which an insulation layer and a first electrode communicated with a first wiring are formed, formed on a main surface side of the substrate; a second layer in which a phase change recording film is deposited on the insulation layer and the first electrode film; and a third layer, in which a second electrode communicated with a second wiring is formed, deposited on the phase change recording film, wherein the phase change recording film contains at least two of Ge, Sb and Te as constituting elements thereof, and the first electrode contains group of Ti, Si and N or group of Ta, Si and N as a main constituting material thereof, and the insulation film contains $TiO_xN_y$, $TaO_xN_y$, $TiSi_xO_yN_z$ or $TaSi_xO_yN_z$ as a main constituting material thereof.

The insulation film comprises a first insulation layer and a second insulation layer located between the first insulation layer and the phase change recording film, and the insulation layer has an average distance between nearest neighbor atoms more closer to an average distance between nearest neighbor atoms of main constituting material of the phase change recording film than an average distance between nearest neighbor atoms of the first insulation layer.

According to a third aspect of the present invention, there is provided a phase change memory comprising: a substrate; an insulation film formed on a main surface of the substrate; a first electrode deposited on the insulation film; a phase change recording film deposited on the first electrode; and a second electrode deposited on the phase change recording film, wherein the phase change recording film contains at least two constituting elements selected from Ge, Sb and Te, and the phase change recording film is in tesile strain state.

According to a fourth aspect of the present invention, there is provided a phase change recording medium comprising: a substrate; a first dielectric film formed on a main surface of the substrate; a recording film deposited on the first dielectric film; and a second dielectric film deposited on the recording film, wherein the recording film contains at least one of $GeSb_2Te_4$, $Ge_2Sb_2Te_5$ and $Ge_6Sb_2Te_9$ as main constituting material thereof, and the first dielectric film contains $TiO_xN_y$, $TaO_xN_y$, $TiSi_xO_yN_z$, $TaSi_xO_yN_z$, $TiSi_xO_yN_z$ or $TaSi_xO_yN_z$ as main constituting material thereof.

The term "a main constituting material" used in the present text means a material included with highest concentration. An accurate composition ratio of $GeSb_2Te_4$ for instance is Ge:Sb:Te=1:2:4, but $GeSb_2Te_4$ of which composition ratio deviated within a range of 10% or less such as Ge:Sb:Te=1:2.2:4 is deemed to be substantially the same and is included.

Other objects, features and advantages of the invention will become apparent from the following description of the embodiments of the invention taken in conjunction with the accompanying drawings.

DETAILED DESCRIPTION OF THE INVENTION

The present invention will be described in detail with reference to accompanied drawings. The present invention is not limited to the following embodiments and includes some variations or modifications on the basis of well known arts.

Figure 1:
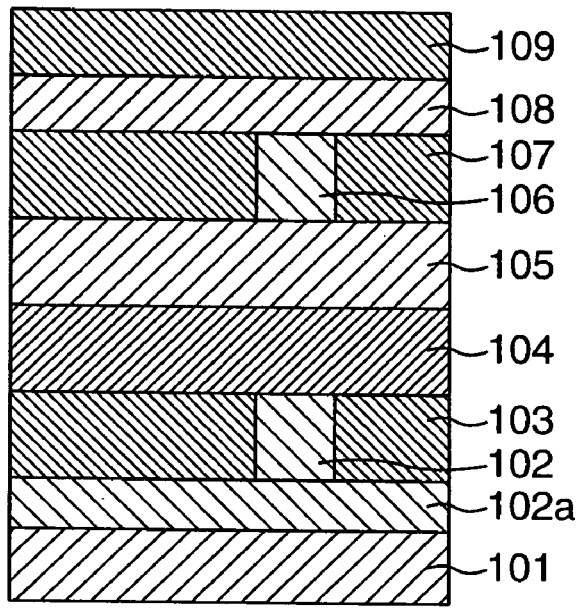
FIG. 1 is a sectional view of a main part of a phase change memory of a first embodiment of the present invention.

FIG. 1 shows a sectional structure of a main part of a phase change memory according to a first embodiment of the present invention. A general outline of a phase change memory is described in Applied Physics Vol. 71, No. 12 (2002), pp. 1513–1217. A phase change memory of the embodiment of the present invention is fabricated by successively overlaying a wiring film 102a, a lower electrode film 102, an insulation film 103, a phase change recording film 104, an upper electrode film 105, a wiring film 106, an insulation film 107, a wiring film 108 and then an insulation film 109 on a silicon substrate 101, for example. Each films may be formed by sputtering, CVD, plating or else.

The phase change recording film 104 preferably contains at least two constituting elements selected from Ge, Sb and Te. It is preferable to contain Te. For example, $GeSb_2Te_4$, $Ge_2Sb_2Te_5$, $Ge_6Sb_2Te_9$, $ZnSb_xTe_y$, $ZnGe_xTe_y$, $ZnGe_xSb_yTe_z$ or $GeSb_xTe_y$, may be a main constituting material. $GeSb_2Te_4$, $Ge_2Sb_2Te_5$ and $Ge_6Sb_2Te_9$ have an advantage that their phase changing speeds are high, while $ZnSb_xTe_y$, $ZnGe_xTe_y$, $ZnGe_xSb_yTe_z$ and $GeSb_xTe_y$ have an advantage that they have high mechanical strength.

As a material for the lower electrode film 102, it is preferable to use amorphous material, which has an atomic arrangement similar to an amorphous phase of the phase change recording film 104 in order to stabilize the amorphous phase of the phase change recording film 104. $TiSi_xN_y$, and $TaSi_xN_y$, may be exemplified as the amorphous material, which has the atomic arrangement similar to an amorphous phase of the phase change recording film 104.

$TiSi_xN_y$, and $TaSi_xN_y$, are amorphous material with an average distance of 0.3 nm or so between nearest neighbor atoms at a contact interface. Since the main constituent, e.g. $GeSb_2Te_4$, $Ge_2Sb_2Te_5$, $Ge_6Sb_2Te_9$, $ZnSb_xTe_y$, $ZnGe_xTe_y$, $ZnGeSb_yTe_z$ or $GeSb_xTe_y$, of the phase change recording film 104 has an average distance of 0.3 nm or so between nearest neighbor atoms in an amorphous state, the amorphous phase of the phase change recording film 104 is stabilized when $TiSi_xN_y$ or $TaSi_xN_y$ is in contact with the phase change recording film 104. The average distance between nearest neighbor atoms at the contact interface is made to be an average distance between nearest neighbor atoms in a crystal face parallel to the contact interface. The average distance between nearest neighbor atoms in embodiments hereinafter is a value in the crystal face.

It is preferable that difference between the average distance between nearest neighbor atoms of the main constituting material in the recording film 104 and the average distance between nearest neighbor atoms in the lower electrode film 102, which is in contact with the recording film 104, is smaller. It is substantially preferable that the difference is a value of degree in which interface defect does not occur, that is, the difference is within 3% of the average distance between nearest neighbor atoms in the recording medium. Further, in view of improving stability of components, for example, in view of restraining diffusion, it is preferable to limit the difference within 1.5% of the average distance. The distance between nearest neighbor atoms in the recording film is preferably measured in an amorphous state but may be measured in a crystalline state accounting easiness of measurement.

Strain can be measured from difference between diffraction peaks in X-ray diffraction, for example. In order to obtain sharper diffraction peaks, fine illuminating radiation such as synchrotron orbit radiation may be used.

In order to show this effect, the inventors have analyzed an activation energy necessary for transformation of the phase change recording film 104 from an amorphous phase to a crystal phase by molecular dynamics simulation. The molecular dynamics simulation is method in which a force, which is applied to each atom, is calculated through an interatomic potential, and Newton's equation of motion is solved in response to the calculated force so as to identify a position of each atom at a certain time, as disclosed in Journal of Applied Physics Vol. 54 (1983) p. 4877. In the present embodiment, charge-transfer was incorporated as a factor in the above molecular dynamics simulation to calculate interactions between different elements, and the below-mentioned relationship could be obtained.

The process to analyze an activation energy necessary for transformation of a recording film 104 from an amorphous phase to a crystal phase by a molecular dynamics is as follows.

The recording film 104 is initially held in an amorphous state. A crystallization time until the amorphous recording film 104 is transformed to a crystal phase is measured at 600° C. and 700° C. The measurement results are illustrated as Arrhenius spots according to a conventional process. A straight line is drawn in the manner that it passes the two spots, which represent measurement results at the two different temperatures. An activation energy is calculated from an inclination of the straight line.

Figure 2:
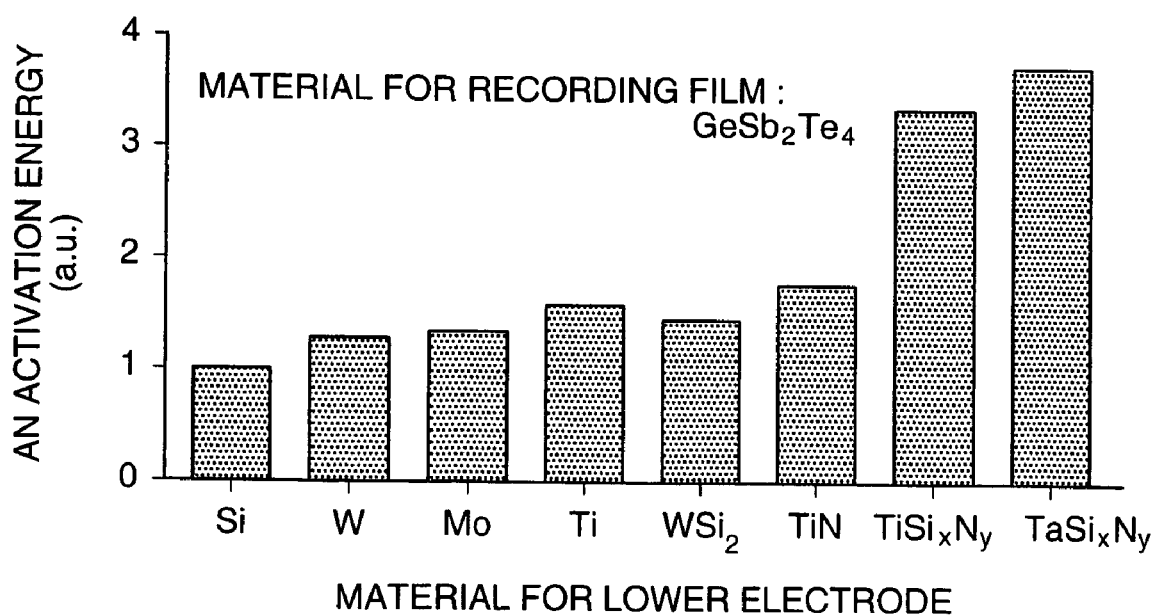
FIG. 2 is a graph showing dependency of an activation energy to transform from an amorphous phase to a crystal phase upon a lower electrode material when $GeSb_2Te_4$ is used as a recording film.

FIG. 2 shows dependency of an activation energy upon a main constituting material of a lower electrode film 102 when $GeSb_2Te_4$ is used as a main constituting material of the phase change recording film 104. It is found from results in FIG. 2 that an activation energy is remarkably large when a lower electrode film comprises $TiSi_xN_y$ or $TaSi_xN_y$ which is an amorphous material with an average distance of 0.3 nm or so between nearest neighbor atoms in a contact interface, and an amorphous phase of the phase change recording film 104 is stabilized. In this embodiment, $TiSi_xN_y$ is prepared by adding 1 at. % Si to TiN, while $TaSi_xN_y$ is prepared by adding 1 at. % Si to TaN.

Figure 3:
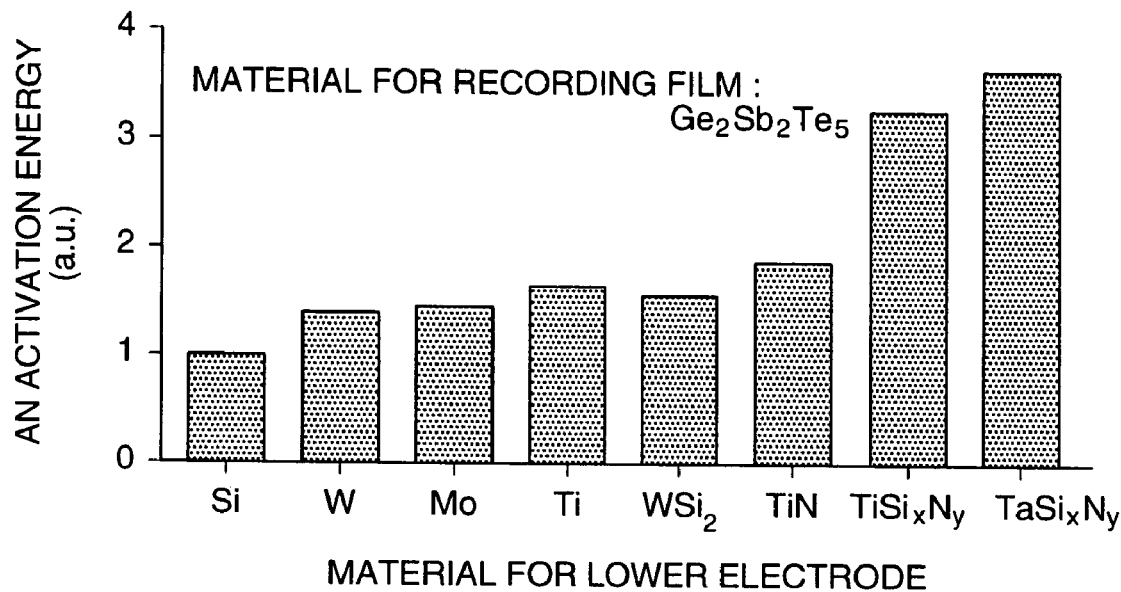
FIG. 3 is a graph showing dependency of an activation energy to transform from an amorphous phase to a crystal phase upon a lower electrode material when $Ge_2Sb_2Te_5$ is used as a recording film.

FIG. 3 shows dependency of an activation energy upon a main constituting material of a lower electrode film 102 when $Ge_2Sb_2Te_5$ is used as a main constituting material of the phase change recording film 104. Similar to the case of FIG. 2, it is found from results in FIG. 3 that an activation energy is remarkably large when a lower electrode film comprises $TiSi_xN_y$ or $TaSi_xN_y$ which is an amorphous material with an average distance of 0.3 nm or so between nearest neighbor atoms in a contact interface, and an amorphous phase of the phase change recording film 104 is stabilized.

When the recording film includes at least two elements selected from the group of Ge, Sb and Te and one element selected from the group of Ge, Sb and Te as a main constituting element, the same results can be obtained as in FIGS. 2 and 3 although the results are not shown.

Figure 4:
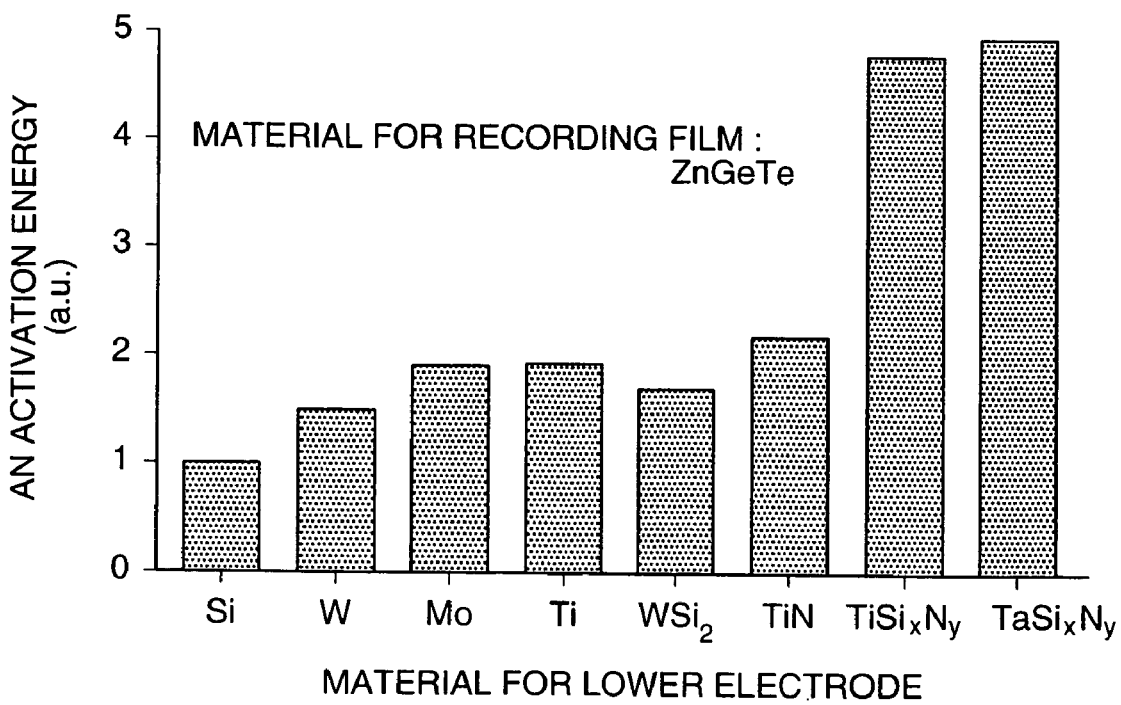
FIG. 4 is a graph showing dependency of an activation energy to transform from an amorphous phase to a crystal phase upon a lower electrode material when ZnGeTe is used as a recording film.
Figure 5:
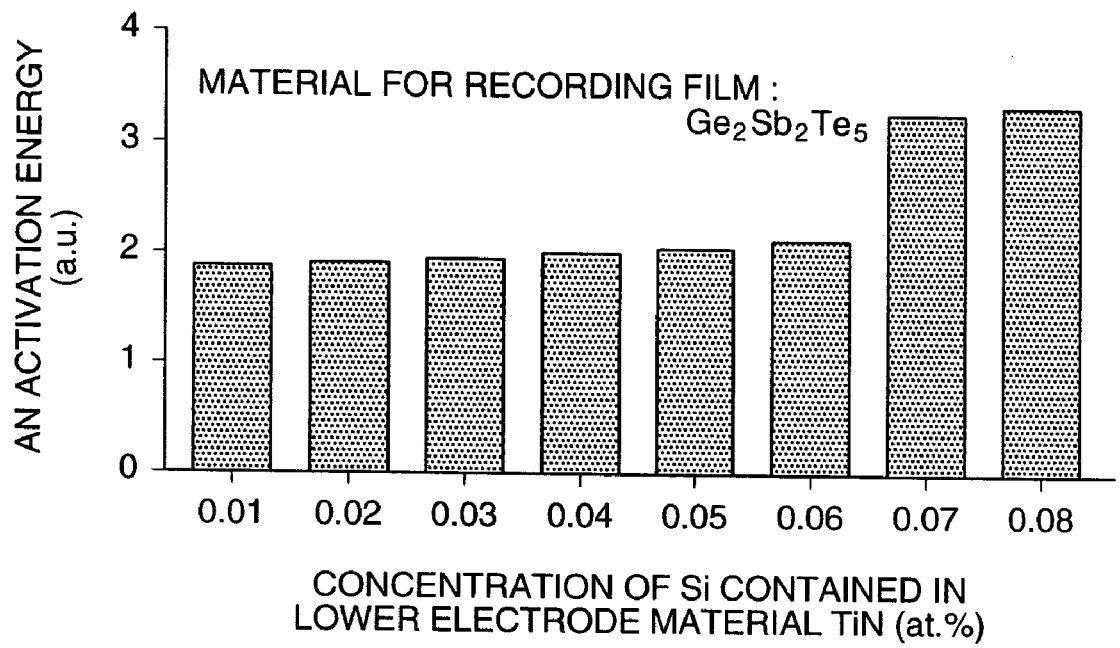
FIG. 5 is a graph showing dependency of an activation energy to transform from an amorphous phase to a crystal phase upon thin concentration region of Si contained in TiN when $Ge_2Sb_2Te_5$ is used as a recording film and TiN is used as a lower electrode.
Figure 6:
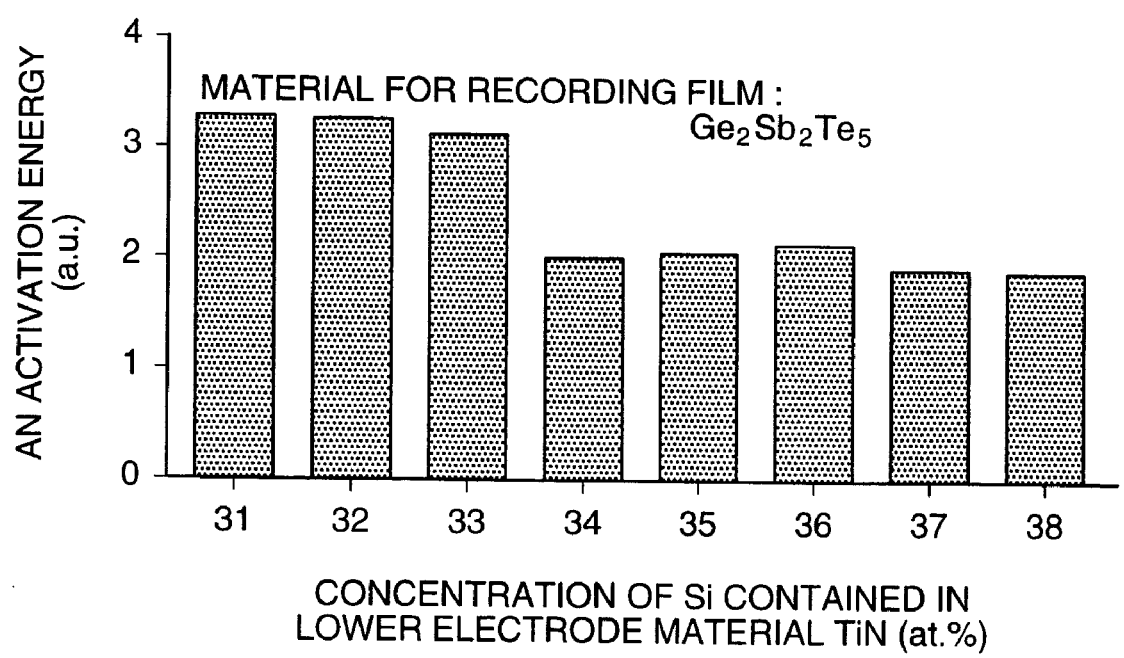
FIG. 6 is a graph showing dependency of an activation energy to transform from an amorphous phase to a crystal phase upon thick concentration region of Si contained in TiN when $Ge_2Sb_2Te_5$ is used as a recording film and TiN is used as a lower electrode.
Figure 7:
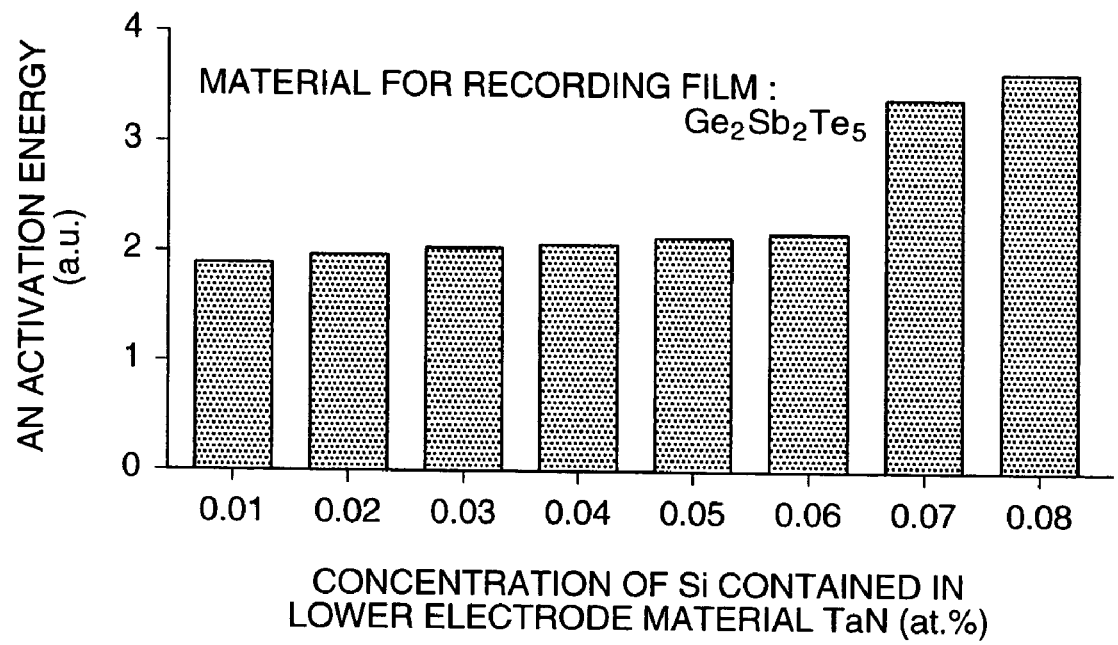
FIG. 7 is a graph showing dependency of an activation energy to transform from an amorphous phase to a crystal phase upon thin concentration region of Si contained in TaN when $Ge_2Sb_2Te_5$ is used as a recording film and TaN is used as a lower electrode.
Figure 8:
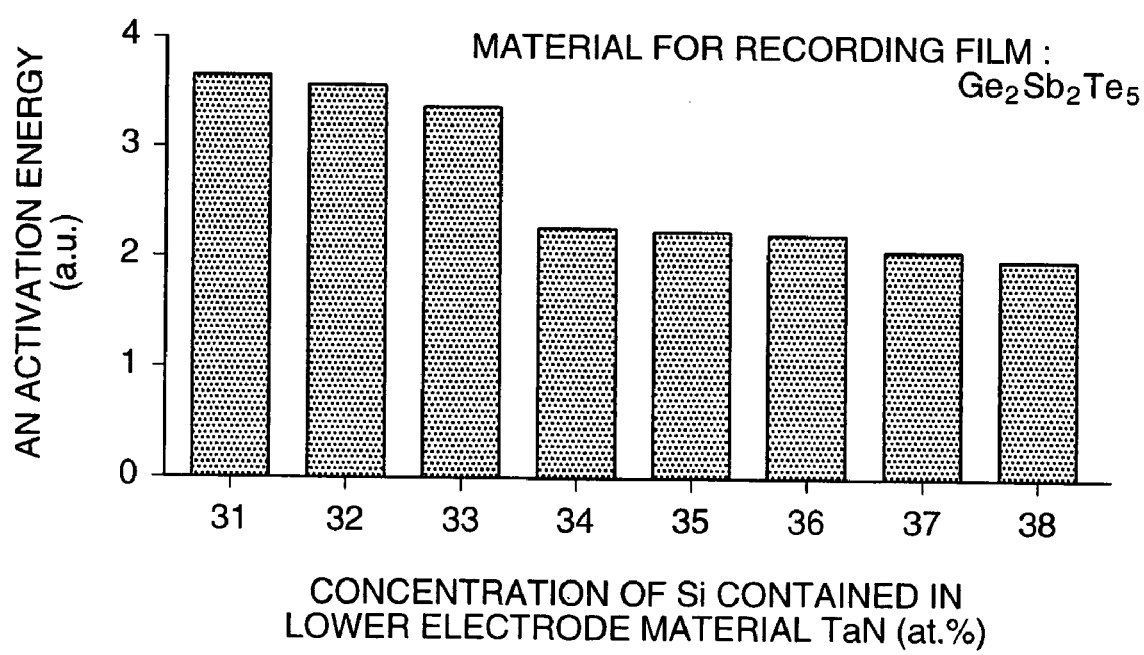
FIG. 8 is a graph showing dependency of an activation energy to transform from an amorphous phase to a crystal phase upon thick concentration region of Si contained in TaN when $Ge_2Sb_2Te_5$ is used as a recording film and TaN is used as a lower electrode.

FIG. 4 shows dependency of an activation energy upon a main constituting element of a lower electrode film 102 when ZnGeTe is used as a main constituting element of a recording film 104. Similar to the cases of FIGS. 2 and 3, it is found from results in FIG. 4 that an activation energy is remarkably large when a lower electrode film comprises $TiSi_xN_y$ or $TaSi_xN_y$ which is an amorphous material with an average distance of 0.3 nm or so between nearest neighbor atoms in a contact interface, and an amorphous phase of the phase change recording film 104 is stabilized. The effect on stabilization is superior to those in FIGS. 2 and 3.

In the light of these features, when the recording film includes at least two elements selected from the group of Ge, Sb and Te and one element selected from the group of Ge, Sb and Te as a main constituting element, combination including at least Te is preferable. Further, when the recording film further includes Zn as a constituting element, an amorphous phase is more stabilized.

In the embodiments described above, effects that an amorphous phase of a phase change recording film 104 is stabilized are shown by using material prepared by adding 1 at. % Si to TiN as $TiSi_xN_y$ and by using material prepared by adding 1 at. % Si to TaN as $TaSi_xN_y$.

FIGS. 5 to 8 shows dependency of the above described effects upon Si concentration. From FIGS. 5 to 8, it is found that an activation energy is large and effect to stabilize an amorphous phase of the phase change recording film 104 is high when Si concentration is within a range of 0.07–33 at. %. Accordingly, it is preferable that Si concentration is within the above-described range. The reason of this is as follows. There is effect that addition of Si at a ratio of 0.07 at. % or more is apt to transform TiN and TaN into an amorphous phase and therefore ensures stabilization of an amorphous phase of a recording film 104. However, excess Si above 33 at. % significantly decreases an average distance less than 0.3 nm between nearest neighbor atoms at a contact interface, so that the effect to stabilize the amorphous phase of the recording film 104 becomes weak.

FIGS. 5 to 8 show cases in which $Ge_2Sb_2Te_5$ is used as the phase change recording film 104, but the same effects of addition amount of Si are also realized on other recording film materials regardless of magnitude of an activation energy.

In the case where width of the lower electrode film 102 is narrower than that of the phase change recording film 104 as shown in FIG. 1, the lower electrode film 102 is necessarily formed with a narrow width and it is preferable to form the lower electrode film 102 by CVD or plating on fabrication of a precise electrode film. Further, when width of the lower electrode film 102 is narrower than that of the phase change recording film 104, the insulation film 103 is in contact with the recording film 104 and the lower electrode film 102, and therefore, it is effective that the insulation film 103 is amorphous material with an average distance of 0.3 nm or so between nearest neighbor atoms at a contact interface in order to stabilize an amorphous phase of the recording film 104. A difference in the average distance between the insulation film 103 and the recording film 104 is preferably controlled to a value within 3% of the average distance of the insulation film, since when an amorphous material with an average distance of 0.3 nm or so between nearest neighbor atoms in a contact interface is used as the lower electrode film 102, the amorphous phase of the phase change recording medium 104 is stabilized as is already described with reference to FIGS. 2 to 4. Amorphous material with an average distance of 0.3 nm or so between nearest neighbor atoms suitable for formation of the insulation film 103 is $TiO_xN_y$, $TaO_xN_y$, $TiSi_xO_yN_z$ and $TaSi_xO_yN_z$, for example.

It is advantageous to impart tensile strain to the phase change recording film 104 in order to improve rewriting tolerance of the phase change recording film 104, since a stress can be relaxed by the tensile strain during transformation of the recording film 104 from a crystal phase to an amorphous phase. In order to impart the tensile strain to the phase change recording film 104, the upper electrode film 105 is preferably film that is formed by at least one of oxidizing, nitriding and oxynitriding. Particularly, in a case of oxidizing, it is preferable to use $RuO_2$ film or $IrO_2$ film, which is an oxide film and conductive, as the upper electrode film 105. In a case of nitriding, it is preferable to use TiN film or WN film which is a nitride film and conductive, as the upper electrode film 105. The effect of this embodiment can be observed even if calculation conditions are changed.

A tensile strain is calculated from a deviation of a diffraction peak in X-ray analysis for instance. Fine radiation, e.g. synchrotron radiation, may be employed for producing a sharp diffraction peak.

Figure 9:
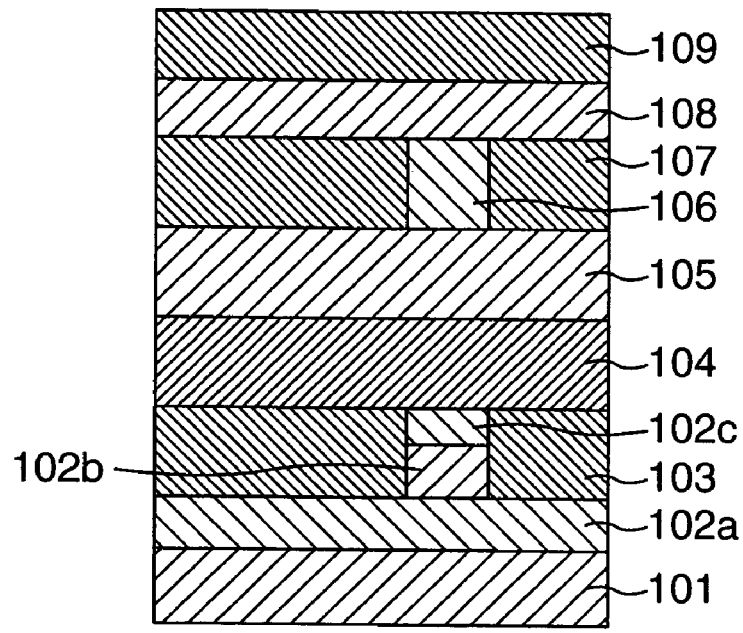
FIG. 9 is a sectional view of a main part of a phase change memory of a second embodiment of the present invention.

FIG. 9 schematically illustrates a sectional structure of a main part in a phase change memory of a second embodiment of the present invention. The second embodiment is basically the same as that in the first embodiment. The difference between the first and second embodiments is that the lower electrode film 102 comprises sub-layers 102b and 102c overlaid together along a vertical direction.

In this phase change memory, a first lower electrode film 102b is preferably made of material well-adherent to the wiring film 102a and a second lower electrode film 102c is preferably made of amorphous material with an atomic arrangement similar to an amorphous phase of the recording film 104 for the purpose of stabilizing the amorphous phase of the recording film 104. The amorphous material having an atomic arrangement similar to that of the amorphous phase of the recording film 104 and suitable for the second lower electrode film 102c is $TiSi_xN$ or $TaSi_xN_y$, as above-mentioned, for example.

The phase change memory shown in FIG. 9 includes the first lower electrode film 102b and the second lower electrode film 102c positioned at a side of the phase change recording film 104 and adjacent to the phase change recording film 104, and the second lower electrode film 102c has an average distance between nearest neighbor atoms more closely to an average distance between nearest neighbor atoms of a main constituting element in the recording film 104 than an average distance between nearest neighbor atoms in the first lower electrode film 102b.

Figure 10:
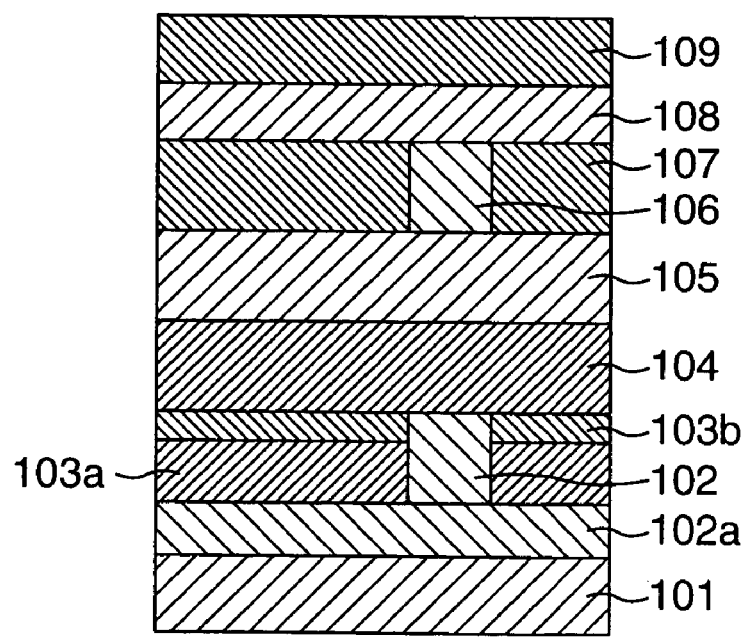
FIG. 10 is a sectional view of a main part of a phase change memory of a third embodiment of the present invention.

FIG. 10 schematically illustrates a sectional structure of a main part in a phase change memory of a third embodiment of the present invention. The third embodiment is basically the same structure as that in the first embodiment. The difference between the first and third embodiments is that the insulation film 103 comprises sub-layers 103a and 103b overlaid together along a vertical direction.

In this phase change memory, a first insulation film 103a is preferably made of material well-adherent to the wiring film 102a and a second insulation film 103b is preferably made of amorphous material with an atomic arrangement similar to an amorphous phase of the recording film 104 for the purpose of stabilizing the amorphous phase of the recording film 104. The amorphous material having an atomic arrangement similar to that of the amorphous phase of the recording film 104 and suitable for the second lower electrode film 102c is $TiO_xN_y$, $TaO_xN_y$, $TiSi_xO_yN_z$ or $TaSi_xO_yN_z$ as above-mentioned, for example.

The phase change memory shown in FIG. 10 includes the first insulation film 103a and the second insulation film 103b positioned at a side of the phase change recording film 104 and adjacent to the phase change recording film 104, and the second insulation film 103b has an average distance between nearest neighbor atoms more closely to an average distance between nearest neighbor atoms of a main constituting element in the recording film 104 than an average distance between nearest neighbor atoms in the first insulation film 103a.

Figure 11:
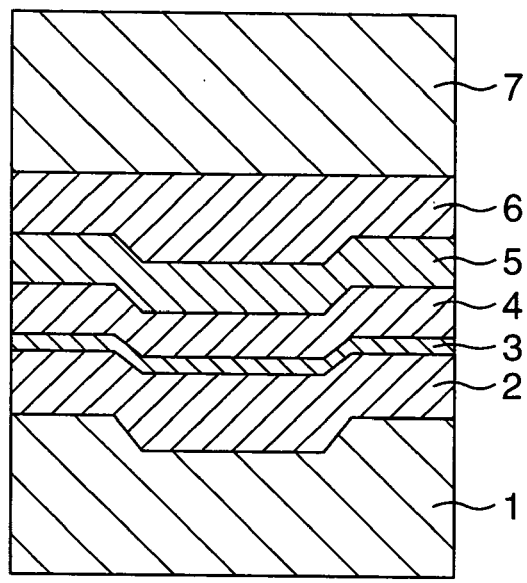
FIG. 11 is a sectional view of a main part of a phase change recording medium of a fourth embodiment of the present invention.

FIG. 11 schematically illustrates a sectional structure of a phase change recording medium of a forth embodiment of the present invention. The phase change recording medium, which is designed for an optical disc, is fabricated by successively overlaying a lower dielectric film 2, a phase change recording film 3, an upper dielectric film 4, a reflection film 5, an overcoat film 6 and a polycarbonate film 7 on a polycarbonate substrate 1.

The phase change recording film 4 contains at least two constitutional elements selected from the group consisting of Ge, Sb and Te. A main constituent of the phase change recording film 4 is $GeSb_2Te_4$, $Ge_2Sb_2Te_5$, $Ge_6Sb_2Te_9$, $ZnSb_xTe_y$, $ZnGe_xTe_y$, $ZnGe_xSb_yTe_z$ or $GeSb_xTe_y$. The constituent $GeSb_2Te_4$, $Ge_2Sb_2Te_5$ or $Ge_6Sb_2Te_9$ has an advantage that phase changing speed is high and the constituent $ZnSb_xTe_y$, $ZnGe_xTe_y$, $ZnGe_xSb_yTe_z$ or $GeSb_xTe_y$ has an advantage that mechanical strength is strong.

The lower dielectric film 2 and the upper dielectric film 4 may be formed by sputtering, CVD, plating or else. The lower dielectric film 2 is in contact with the recording film 3, and therefore, it is effective that the lower dielectric film 2 is made of amorphous material with an average distance of 0.3 nm or so between nearest neighbor atoms at a contact interface for the purpose of stabilizing the amorphous phase of the phase change recording film 4. The specified distance in the lower dielectric layer 2 is suitable for stabilizing an amorphous phase of the recording film 3, by the same reason as in the relationship between the lower electrode film 102 and the recording film 104 in FIG. 1, as above-explained with FIGS. 2 to 4. The amorphous material having an average distance of 0.3 nm or so between nearest neighbor atoms at a contact interface and suitable for the lower dielectric layer 2 is $TiO_xN_y$, $TaO_xN_y$, $TiSi_xO_yN_z$ or $TaSi_xO_yN_z$ for instance.

In order to improve rewriting tolerance, tensile strain may be imparted to the recording film 3 by applying a compressive strain to the upper dielectric film 4. Impartment of tensile strain is accomplished by subjecting the upper dielectric layer 4 to oxidizing, nitriding or oxynitriding when the upper dielectric film 4 is formed.

Figure 12:
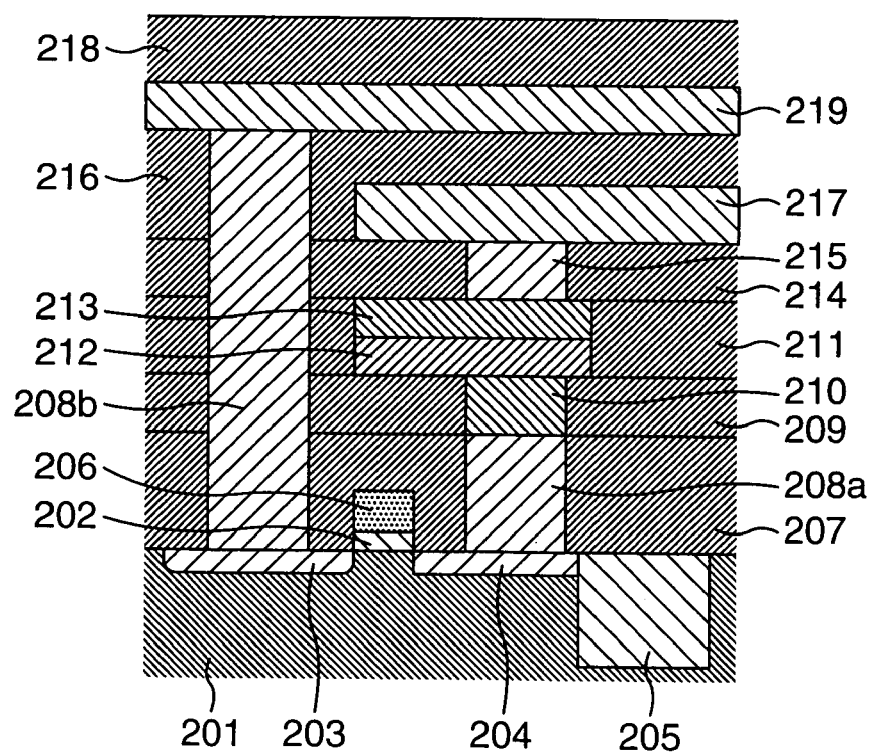
FIG. 12 is a sectional view of a min part of a phase change memory using a transistor for selection of a certain memory cell.

FIG. 12 schematically illustrates a sectional structure of a main portion of a phase change memory of a fifth embodiment of the present invention. In the present phase change memory, a gate insulation film 202 and a gate electrode 206, which structure a transistor, are formed on a silicon substrate 201, for example, and further wiring is formed in diffusion layers 203 and 204 as source and drain.

The phase change memory in FIG. 12 has wiring 208a in electrically communication with the diffusion layer 204, wiring 208b in electrically communication with the diffusion layer 203, and wiring 215, 217, 219. A lower electrode film 210 in electrically communication with the wiring 208b, a phase change recording film 212 deposited on the lower electrode film 210, and an upper electrode film 213 deposited on the phase change recording film 212, are isolated by insulation layers 207, 209, 211, 214, 216 and 218.

Figure 13:
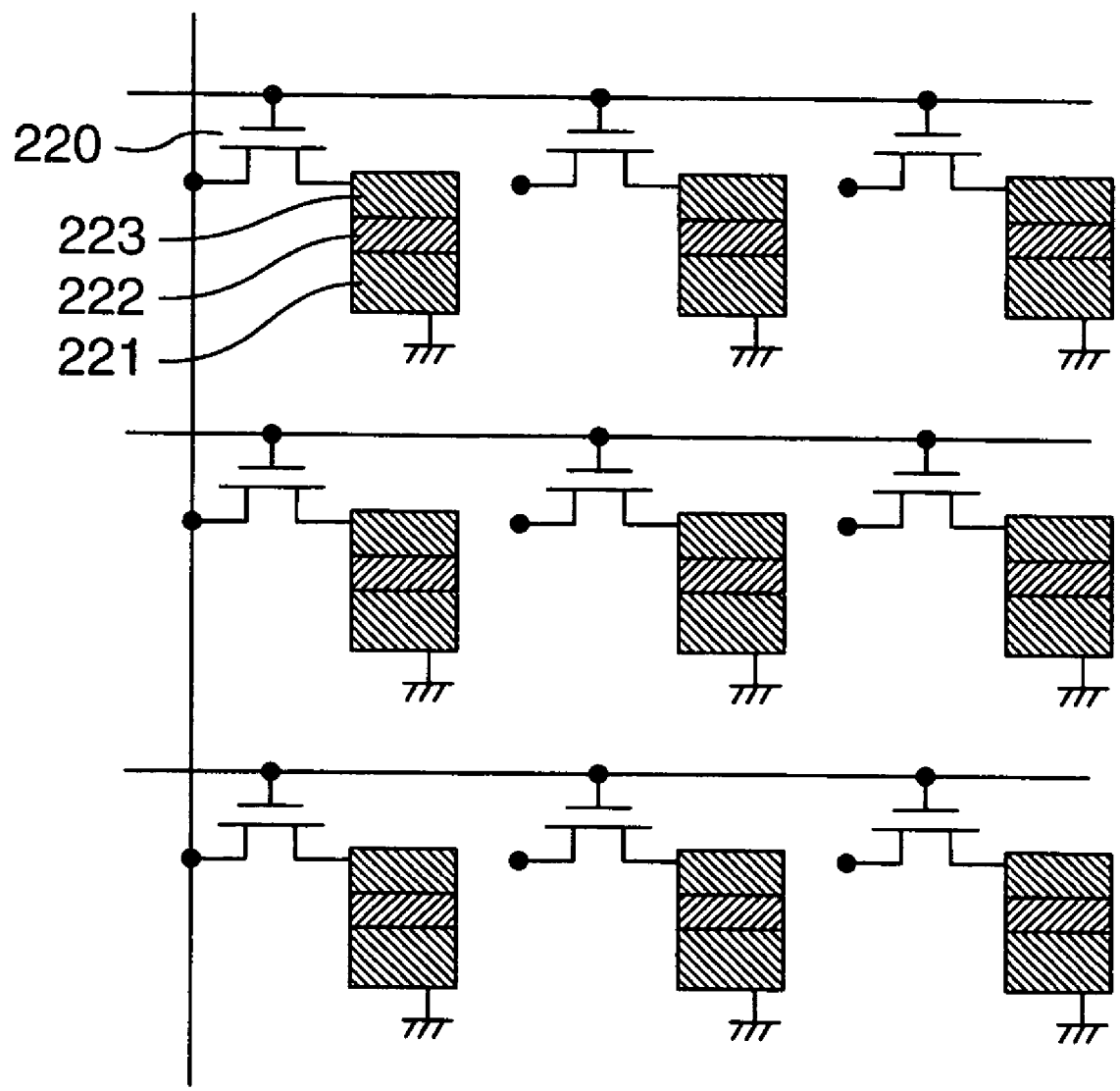
FIG. 13 is a view showing a circuit structure of a phase change memory using transistors for selection of a certain memory cell.

A transistor, which is composed of the gate electrode 206, the gate insulation film 202 and the substrate 201 in FIG. 12, corresponds to a transistor in a memory circuit shown in FIG. 13, for example. For instance, electrodes 221 and 223 at both sides of a phase change recording film 223 in FIG. 13 are turned on or off by a transistor 220 so as to allow access to a certain memory cell at a designated address.

The structure is the same as a structure shown in FIG. 3 of JP-A-2003-229358, except materialistic combination. The lower electrode film 210 is advantageously made of amorphous material with an atomic arrangement similar to an amorphous phase of the phase change recording film 212 in order to stabilize the amorphous phase of the phase change recording film 212. In the case where the lower electrode film 210 is narrower than the phase change recording film 212, the insulation layer 209 is formed in contact with the phase change recording film 212 and the lower electrode film 210. In this regard, the insulation layer 209 is preferably made of amorphous material with an average distance of 0.3 nm or so between nearest neighbor atoms at a contact interface in order to stabilize an amorphous phase of the phase change recording film 212.

Figure 14:
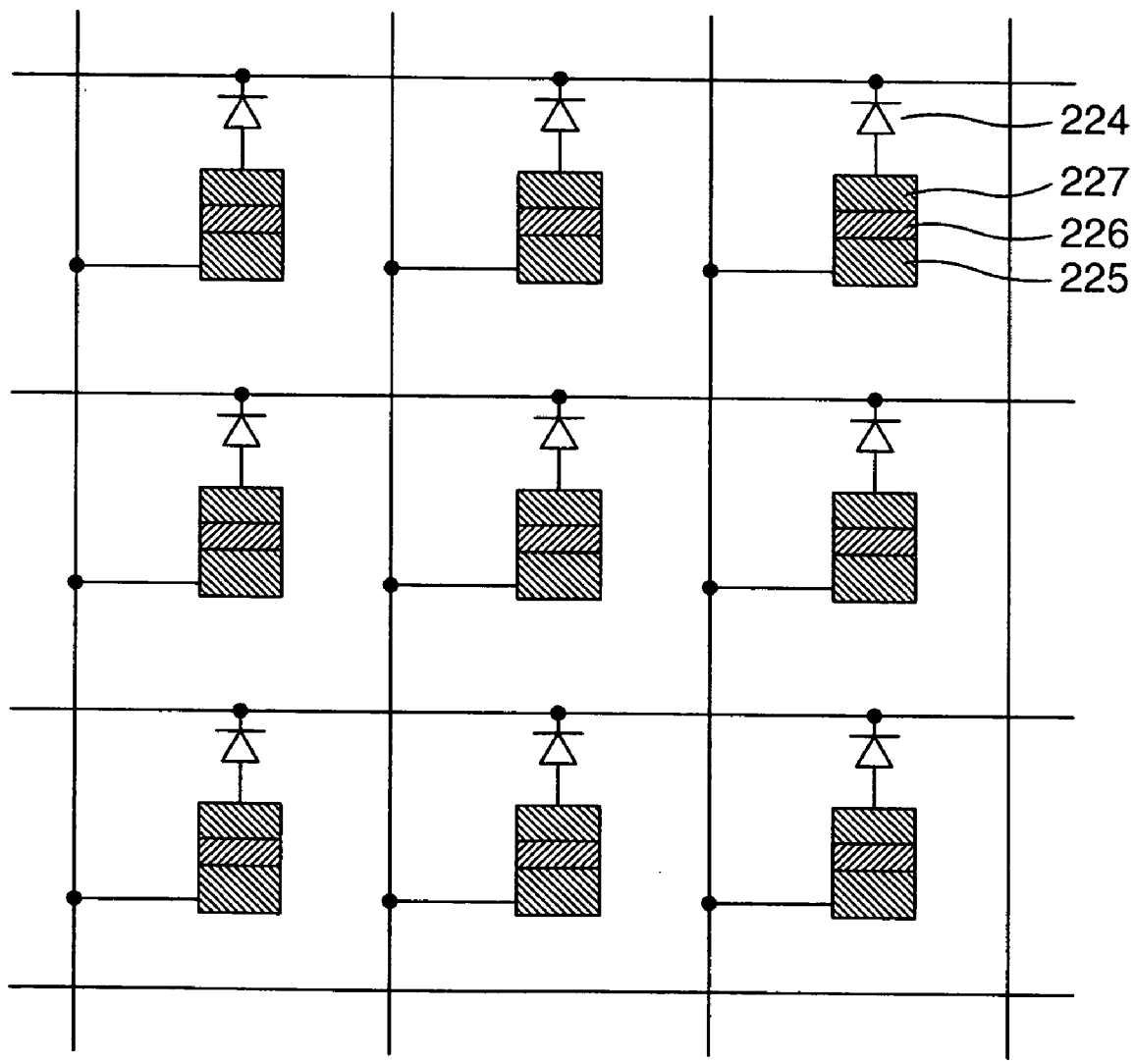
FIG. 14 is a view showing a circuit structure of a phase change memory using diodes for selection of a certain memory cell.

Instead of the circuit structure using transistors shown in FIG. 13, the fifth embodiment can be applied to a circuit structure in which diodes 224 to select a certain memory cell are employed as shown in FIG. 14. In FIG. 14, the numerals 225, 227 denote electrodes, and the numeral 226 denotes a phase change recording film. The structure shown in FIG. 14 is the same as a circuit shown in FIG. 1 of JP-A-2001-127263. The sectional structure in this case may be basically the same as a structure shown in FIG. 3 or FIG. 7 of JP-A-2001-127263.

Figure 15:
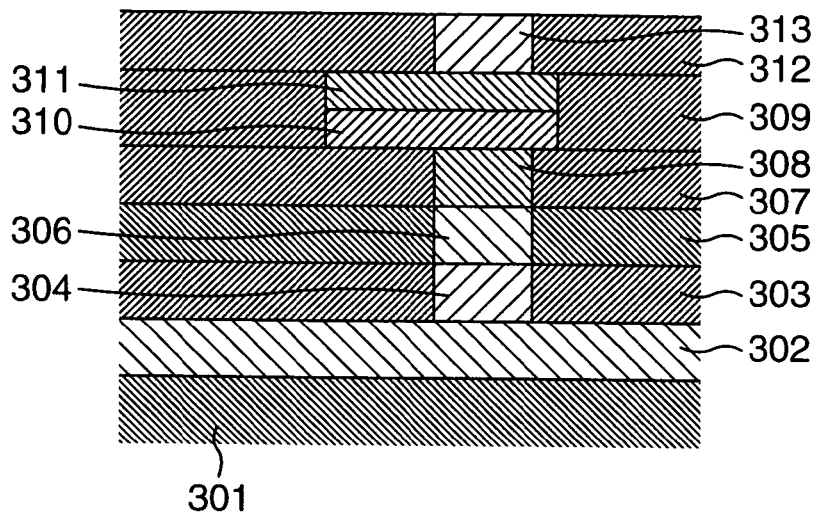
FIG. 15 is a sectional view showing a main part of another phase change memory using a diode for selection of a memory cell.

Another example of a sectional structure is illustrated in FIG. 15. In the structure shown in FIG. 5, wiring 302 is formed on a substrate 301, and semiconductor films 303 and 305 are further formed from polycrystalline silicone thereon. An insulation film 307, a lower electrode film 308, an insulation film 309, a phase change recording film 310, an upper electrode film 311, an insulation film 312 and wiring 313 are successively overlaid on the semiconductor layers 303 and 305. A diode to select a certain memory cell is prepared by ion implantation of the semiconductor layer 303 with an N type dopant to form a n+ domain 304 and ion implantation of the semiconductor film 305 with a p type dopant to form a p+ domain 306.

Also in this phase change memory, the lower electrode film 308 is made of amorphous material with an atomic arrangement similar to an amorphous phase of the phase change recording film 310 in order to stabilize the amorphous phase of the recording film 310. In the case where the lower electrode film 308 is narrower than the recording film 310, the insulation film 307 is in contact with the recording film 310 and the lower electrode film 308. In this regard, the insulation film 307 is advantageously made of amorphous material with an average distance of 0.3 nm or so between nearest neighbor atoms at a contact interface in order to stabilize the amorphous phase of the recording film 310.

Figure 16:
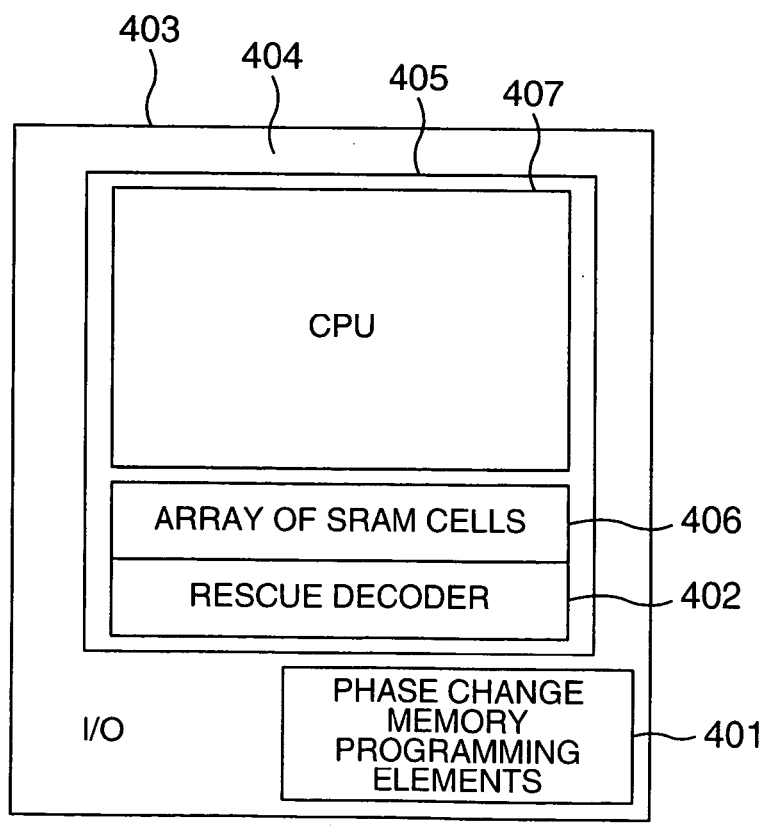
FIG. 16 is a block diagram of a SRAM memory chip equipped with a defect rescue circuit.

For example, JP-A-2001-229690 discloses a semiconductor device, which has a function to retain a rescue addressing signal and a trimming signal in such a nonvolatile memory as a flash memory. When a semiconductor device is structured by using the phase change memory described in the preceding embodiments as nonvolatile memory, a semiconductor device with the above-described effects and high reliability is obtained. An example of a circuit diagram of such semiconductor device is shown in FIG. 16. This example shows an example of a SRAM memory equipped with a defect rescue circuit. In FIG. 16, the numeral 403 is a chip, the numeral 401 is a phase change memory as a programming element, the numeral 402 is a rescue decoder, the numeral 405 is an I/O portion, and the numeral 405 is a core, which has a CPU 407 and an array 406 of SRAM cells. The phase change memory 401 is preferably provided at a center of the I/O portion 404 for reduction of a surface area.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A phase change memory comprising:
   a substrate;
   an insulation film formed on a main surface of the substrate;
   a first electrode deposited on the insulation film;
   a phase change recording film deposited on the first electrode; and
   a second electrode deposited on the phase change recording film,
   wherein the phase change recording film contains at least two of Ge, Sb and Te as main constituting elements thereof, and the first electrode comprises material of group of Ti, Si and N, or group of Ta, Si and N as main constituting material thereof, and a concentration of Si in the first electrode film is between 0.07–33 at. %.

2. A phase change memory according to claim 1, wherein the first electrode film comprises $TiSi_xN_y$ or $TaSi_xN_y$ formed by chemical vapor deposition or plating.

3. A phase change memory according to claim 1, wherein the second electrode is a film formed by at least one of oxidizing, nitriding and oxynitriding.

4. A phase change memory according to claim 1, wherein the phase change recording film contains Zn as a constituting element.

5. A phase change memory comprising:
   a substrate;
   an insulation film formed on a main surface of the substrate;
   a first electrode deposited on the insulation film;
   a phase change recording film deposited on the first electrode; and
   a second electrode deposited on the phase change recording film,
   wherein the phase change recording film contains at least two of Ge, Sb and Te as main constituting elements thereof, and the first electrode comprises material of group of Ti, Si and N, or group of Ta, Si and N as main constituting material thereof, and a difference in an average distance between nearest neighbor atoms between the phase change recording film and the first electrode is within 3% of the average distance between nearest neighbor atoms of the phase change recording film.

6. A phase change memory comprising:
   a substrate;
   an insulation film formed on a main surface of the substrate;
   first electrode deposited on the insulation film;
   a phase change recording film deposited on the first electrode; and a second electrode deposited on the phase change recording film, wherein the phase change recording film contains at least two of Ge, Sb and Te as main constituting elements thereof, and the first electrode comprises material of group of Ti, Si and N, or group of Ta, Si and N as main constituting material thereof, and wherein the first electrode comprises a first electrode layer and a second electrode layer located between the first electrode layer and the phase change recording film, and the second electrode layer has an average distance between nearest neighbor atoms more closer to an average distance between nearest neighbor atoms of main constituting material of the phase change recording film than an average distance between nearest neighbor atoms of the first electrode layer.

7. A phase change memory according to claim 6, wherein the first electrode film comprises $TiSi_xN_y$ or $TaSi_xN_y$ formed by chemical vapor deposition or plating.

8. A phase change memory according to claim 6, wherein the second electrode is a film formed by at least one of oxidizing, nitriding and oxynitriding.

9. A phase change memory according to claim 6, wherein the phase change recording film contains Zn as a constituting element.

10. A phase change memory according to claim 5, wherein the first electrode film comprises $TiSi_xN_y$ or $TaSi_xN_y$ formed by chemical vapor deposition or plating.

11. A phase change memory according to claim 5, wherein the second electrode is a film formed by at least one of oxidizing, nitriding and oxynitriding.

12. A phase change memory according to claim 5, wherein the phase change recording film contains Zn as a constituting element.

* * * * *